(12) United States Patent
Matsuyama

(10) Patent No.: US 10,884,337 B2
(45) Date of Patent: Jan. 5, 2021

(54) SUBSTRATE PROCESSING APPARATUS AND SUBSTRATE PROCESSING METHOD

(71) Applicant: TOKYO ELECTRON LIMITED, Tokyo (JP)

(72) Inventor: Kenichirou Matsuyama, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/878,171

(22) Filed: May 19, 2020

(65) Prior Publication Data
US 2020/0371440 A1    Nov. 26, 2020

(30) Foreign Application Priority Data
May 20, 2019   (JP) .................................. 2019-094662

(51) Int. Cl.
G03F 7/30 (2006.01)
H01L 21/677 (2006.01)

(52) U.S. Cl.
CPC ...... *G03F 7/3042* (2013.01); *H01L 21/67748* (2013.01)

(58) Field of Classification Search
CPC ............... H01L 21/677; H01L 21/2636; H01L 21/2667; G03F 7/3042
USPC .......................................................... 355/27, 30
See application file for complete search history.

(56) References Cited

U.S. PATENT DOCUMENTS

2017/0185077 A1*   6/2017   Ikeda ................ H01L 21/67184
2018/0063916 A1*   3/2018   Ahn ........................ F21V 29/76

FOREIGN PATENT DOCUMENTS

JP            2010-147424 A       7/2010

* cited by examiner

*Primary Examiner* — Hung Nguyen
(74) *Attorney, Agent, or Firm* — Nath, Goldberg & Meyer; Jerald L. Meyer (57) ABSTRACT

A substrate processing apparatus includes: a plurality of unit blocks, each having a plurality of modules for processing substrates and a substrate transfer path; a plurality of main transfer mechanisms, each being provided on the substrate transfer path, and configured to transfer the substrates among the plurality of modules; a loading and unloading transfer mechanism configured to load and unload the substrates with respect to each of the unit blocks; a memory configured to store substrate transfer history for each of the unit blocks; and a setting part configured to update a cycle time, which is a time required for a corresponding one of the main transfer mechanisms to move around the substrate transfer path once, of each of the unit blocks based on the substrate transfer history, and configured to set a transfer schedule of the substrates in each of the unit blocks based on the updated cycle time.

9 Claims, 8 Drawing Sheets

| | CSWP | | | SCPL | | DEV | | | | CGHP | | | SCPL' | |
|---|---|---|---|---|---|---|---|---|---|---|---|---|---|---|
| | 1 | 2 | 3 | 1 | 2 | 1 | 2 | 3 | 4 | 1 | 2 | 3 | 1 | 2 |
| 1 | A1 | | | | | | | | | | | | | |
| 2 | ↓ | | | | | | | | | | | | | |
| 3 | ↓ | | | | | | | | | | | | | |
| 4 | ↓ | A4 | | | | | | | | | | | | |
| 5 | ↓ | ↓ | | | | | | | | | | | | |
| 6 | ↓ | ↓ | | | | | | | | | | | | |
| 7 | ↓ | ↓ | A7 | | | | | | | | | | | |
| 8 | ↓ | ↓ | ↓ | | | | | | | | | | | |
| 9 | ↓ | ↓ | ↓ | | | | | | | | | | | |
| 10 | A10 | ↓ | ↓ | A1 | | | | | | | | | | |
| 11 | ↓ | ↓ | ↓ | ↓ | | | | | | | | | | |
| 12 | ↓ | ↓ | ↓ | ↓ | | | | | | | | | | |
| 13 | ↓ | A13 | ↓ | A4 | | A1 | | | | | | | | |
| 14 | ↓ | ↓ | ↓ | ↓ | | ↓ | | | | | | | | |
| 15 | ↓ | ↓ | ↓ | ↓ | | ↓ | | | | | | | | |
| 16 | ↓ | ↓ | A16 | A7 | | ↓ | A4 | | | | | | | |
| 17 | ↓ | ↓ | ↓ | ↓ | | ↓ | ↓ | | | | | | | |
| 18 | ↓ | ↓ | ↓ | ↓ | | ↓ | ↓ | | | | | | | |
| 19 | A19 | ↓ | ↓ | A10 | | ↓ | ↓ | A7 | | | | | | |
| 20 | ↓ | ↓ | ↓ | ↓ | | ↓ | ↓ | ↓ | | | | | | |
| 21 | ↓ | ↓ | ↓ | ↓ | | ↓ | ↓ | ↓ | | | | | | |
| 22 | ↓ | A22 | ↓ | A13 | | ↓ | ↓ | ↓ | A10 | | | | | |
| 23 | ↓ | ↓ | ↓ | ↓ | | ↓ | ↓ | ↓ | ↓ | | | | | |
| 24 | ↓ | ↓ | ↓ | ↓ | | ↓ | ↓ | ↓ | ↓ | | | | | |
| 25 | ↓ | ↓ | A25 | A16 | | A13 | ↓ | ↓ | ↓ | A1 | | | | |
| 26 | ↓ | ↓ | ↓ | ↓ | | ↓ | ↓ | ↓ | ↓ | ↓ | | | | |
| 27 | ↓ | ↓ | ↓ | ↓ | | ↓ | ↓ | ↓ | ↓ | ↓ | | | | |
| 28 | | ↓ | ↓ | A19 | | ↓ | A16 | ↓ | ↓ | A4 | | | A1 | |
| 29 | | ↓ | ↓ | ↓ | | ↓ | ↓ | ↓ | ↓ | ↓ | | | ↓ | |
| 30 | | ↓ | ↓ | ↓ | | ↓ | ↓ | ↓ | ↓ | ↓ | | | ↓ | |
| 31 | | | ↓ | A22 | | ↓ | ↓ | A19 | ↓ | A7 | | | | A4 |
| 32 | | | ↓ | ↓ | | ↓ | ↓ | ↓ | ↓ | ↓ | | | | ↓ |
| 33 | | | ↓ | ↓ | | ↓ | ↓ | ↓ | ↓ | ↓ | | | | ↓ |
| 34 | | | | A25 | | ↓ | ↓ | ↓ | A22 | A10 | | | A7 | |
| 35 | | | | ↓ | | ↓ | ↓ | ↓ | ↓ | ↓ | | | ↓ | |
| 36 | | | | ↓ | | ↓ | ↓ | ↓ | ↓ | ↓ | | | ↓ | |
| 37 | | | | | | A25 | ↓ | ↓ | ↓ | A13 | | | | A10 |
| 38 | | | | | | ↓ | ↓ | ↓ | ↓ | ↓ | | | | ↓ |
| 39 | | | | | | ↓ | ↓ | ↓ | ↓ | ↓ | | | | ↓ |
| 40 | | | | | | ↓ | | ↓ | ↓ | A16 | | | A13 | |
| 41 | | | | | | ↓ | | ↓ | ↓ | ↓ | | | ↓ | |
| 42 | | | | | | ↓ | | ↓ | ↓ | ↓ | | | ↓ | |
| 43 | | | | | | ↓ | | | ↓ | A19 | | | | A16 |
| 44 | | | | | | ↓ | | | ↓ | ↓ | | | | ↓ |
| 45 | | | | | | ↓ | | | ↓ | ↓ | | | | ↓ |
| 46 | | | | | | ↓ | | | | A22 | | | A19 | |
| 47 | | | | | | ↓ | | | | ↓ | | | ↓ | |
| 48 | | | | | | ↓ | | | | ↓ | | | ↓ | |
| 49 | | | | | | | | | | A25 | | | | A22 |
| 50 | | | | | | | | | | ↓ | | | | ↓ |
| 51 | | | | | | | | | | ↓ | | | | ↓ |
| 52 | | | | | | | | | | | | | A25 | |
| 53 | | | | | | | | | | | | | | |

| Total number of passed wafers | | Passed unit block | | | | | |
|---|---|---|---|---|---|---|---|
| | | E1 | E2 | E3 | E4 | E5 | E6 |
| | | 5000 | 4000 | 3000 | 3500 | 3500 | 5000 |
| Name of used transfer recipe | Standard CT(sec) | Number of passed wafers | | | | | |
| Recipe A | 14.4 | 1000 | 900 | 1100 | 1200 | 600 | 1200 |
| Recipe B | 11.8 | 750 | 1000 | 750 | × | × | 2500 |
| Recipe C | 15.5 | 600 | 600 | × | 900 | 800 | × |
| ... | ... | ... | ... | ... | ... | ... | ... |
| Recipe L | 13.2 | 200 | 200 | 200 | 500 | 200 | 200 |
| Recipe M | 12.0 | × | 60 | 120 | 60 | 60 | 60 |
| Recipe N | 16.0 | × | × | × | 80 | 80 | × |
| ... | ... | ... | ... | ... | ... | ... | ... |
| Recipe Z | 16.0 | 15 | 15 | 14 | 15 | 15 | 14 |
| Cycle time (CT) | | 12 | 12 | 11 | 13 | 12 | 11 |

FIG. 5

| | | Passed unit blocks |
|---|---|---|
| | | E4 |
| Total number of passed wafers | | 3500 |
| Set ratio number of sheets (total number of passed wafers × 0.7) | | 2450 |
| Name of used transfer recipe | Standard CT(sec) | Number of passed wafers |
| Recipe A | 14.4 | 1200 |
| Recipe B | 11.8 | × |
| Recipe C | 15.5 | 900 |
| ... | ... | ... |
| Recipe L | 13.2 | 500 |
| Recipe M | 12.0 | 60 |
| Recipe N | 16.0 | 40 |
| ... | ... | ... |
| Recipe Z | 16.0 | 15 |
| Minimum value of selected standard CT | 13.2 | |
| Rounding down numerical values after decimal point of selected standard CT | 13 | |

|  |  | Passed unit blocks | | | | | |
|---|---|---|---|---|---|---|---|
|  |  | E1 | E2 | E3 | E4 | E5 | E6 |
| Total number of passed wafers | | 5000 | 4000 | 3000 | 3500 | 3500 | 5000 |
| Name of used transfer recipe | Standard CT(sec) | Number of passed wafers | | | | | |
| Recipe A | 14.4 | 1000 | 900 | 1100 | 1200 | 600 | 1200 |
| Recipe B | 11.8 | 750 | 1000 | 750 | × | × | 2500 |
| Recipe C | 15.5 | 600 | 600 | × | 900 | 800 | × |
| ... | ... | ... | ... | ... | ... | ... | ... |
| Recipe L | 13.2 | 200 | 200 | 200 | 500 | 200 | 200 |
| Recipe M | 12.0 | × | 60 | 120 | 60 | 60 | 60 |
| Recipe N | 16.0 | × | × | × | 80 | 80 | × |
| ... | ... | ... | ... | ... | ... | ... | ... |
| Recipe Z | 16.0 | 15 | 15 | 14 | 15 | 15 | 14 |
| Cycle time (CT) | | 12 | 12 | 11 | 13 | 12 | 11 |

|  |  | Passed unit blocks | | | | | |
|---|---|---|---|---|---|---|---|
|  |  | E1 | E2 | E3 | E4 | E5 | E6 |
| Total number of passed wafers | | 4000 | 3100 | 1900 | 2300 | 2900 | 3800 |
| Name of used transfer recipe | Standard CT(sec) | Number of passed wafers | | | | | |
| Recipe B | 11.8 | 750 | 1000 | 750 | × | × | 2500 |
| Recipe C | 15.5 | 600 | 600 | × | 900 | 800 | × |
| ... | ... | ... | ... | ... | ... | ... | ... |
| Recipe L | 13.2 | 200 | 200 | 200 | 500 | 200 | 200 |
| Recipe M | 12.0 | × | 60 | 120 | 60 | 60 | 60 |
| Recipe N | 16.0 | × | × | × | 80 | 80 | × |
| ... | ... | ... | ... | ... | ... | ... | ... |
| Recipe Z | 16.0 | 15 | 15 | 14 | 15 | 15 | 14 |
| Cycle time (CT) | | 12 | 12 | 11 | 13 | 12 | 11 |

FIG. 8

| | | Passed unit blocks | | | | | |
|---|---|---|---|---|---|---|---|
| | | E1 | E2 | E3 | E4 | E5 | E6 |
| Total number of passed wafers | | 5000 | 4000 | 3000 | 3500 | 3500 | 5000 |
| Name of used transfer recipe | Standard CT(sec) | Number of passed wafers | | | | | |
| Recipe A | 14.4 | 1000 | 900 | 1100 | 1200 | 600 | 1200 |
| Recipe B | 11.8 | 750 | 1000 | 750 | × | × | 2500 |
| Recipe C | 15.5 | 600 | 600 | × | 900 | 800 | × |
| ... | ... | ... | ... | ... | ... | ... | ... |
| Recipe L | 13.2 | 200 | 200 | 200 | 500 | 200 | 200 |
| Recipe M | 12.0 | × | 60 | 120 | 60 | 60 | 60 |
| Recipe N | 16.0 | × | × | × | 80 | 80 | × |
| ... | ... | ... | ... | ... | ... | ... | ... |
| Recipe Z | 16.0 | 15 | 15 | 14 | 15 | 15 | 14 |
| Cycle time (CT) | | 12 | 12 | 11 | 13 | 12 | 11 |

| Number of passed wafers in recipe B | E1 | E2 | E3 | E4 | E5 | E6 |
|---|---|---|---|---|---|---|
| | 9 | 8 | 8 | × | × | 25 |

| | | Passed unit blocks | | | | | |
|---|---|---|---|---|---|---|---|
| | | E1 | E2 | E3 | E4 | E5 | E6 |
| Total number of passed wafers | | 5009 | 1008 | 3008 | 3500 | 3500 | 5025 |
| Name of used transfer recipe | Standard CT(sec) | Number of passed wafers | | | | | |
| Recipe A | 14.4 | 1000 | 900 | 1100 | 1200 | 600 | 1200 |
| Recipe B | 11.8 | 759 | 1008 | 758 | × | × | 2525 |
| Recipe C | 15.5 | 600 | 600 | × | 900 | 800 | × |
| ... | ... | ... | ... | ... | ... | ... | ... |
| Recipe L | 13.2 | 200 | 200 | 200 | 500 | 200 | 200 |
| Recipe M | 12.0 | × | 60 | 120 | 60 | 60 | 60 |
| Recipe N | 16.0 | × | × | × | 80 | 80 | × |
| ... | ... | ... | ... | ... | ... | ... | ... |
| Recipe Z | 16.0 | 15 | 15 | 14 | 15 | 15 | 14 |
| Cycle time (CT) | | 12 | 12 | 11 | 13 | 12 | 11 |

SUBSTRATE PROCESSING APPARATUS AND SUBSTRATE PROCESSING METHOD

CROSS-REFERENCE TO RELATED APPLICATION(S)

This application is based upon and claims the benefit of priority from Japanese Patent Application No. 2019-094662, filed on May 20, 2019, the entire contents of which are incorporated herein by reference.

TECHNICAL FIELD

The present disclosure relates to a substrate processing apparatus and a substrate processing method.

BACKGROUND

In a semiconductor device manufacturing process, a semiconductor wafer (hereinafter, referred to as a "wafer") as a substrate is subjected to a photolithography process. A substrate processing apparatus for performing the photolithography process may be configured such that a transfer mechanism sequentially transfers a wafer to a plurality of processing modules, each of which performs a process different from that performed in another processing module. In addition, one or more processing modules that perform the same process may be provided such that wafers of the same lot can be subjected to the same process in parallel.

Patent Document 1 discloses a coating and developing apparatus including a processing block configured by stacking a plurality of unit blocks, each of which is provided with processing modules that perform different processes on wafers and processing modules that perform the same process on the wafers as described above. For each unit block, a time for a substrate transfer mechanism to move around the unit block once (cycle time) is determined by the maximum of values obtained by dividing a time required for performing a process in each processing module by the number of processing modules that performs the process, or the minimum time required for the substrate transfer mechanism to move around the unit block once, whichever is longer. Based on the cycle time and a processing time of a heating module included in the processing modules, the number of stay cycles of a wafer in the heating module (the number of moving-around operations of the substrate transfer mechanism) is determined, and a wafer transfer schedule in each unit block is set.

PRIOR ART DOCUMENT

[Patent Document]
Patent Document 1: Japanese laid-open publication No. 2010-147424

SUMMARY

A substrate processing apparatus of the present disclosure includes: a plurality of unit blocks, each having a plurality of modules and a substrate transfer path, wherein the plurality of unit blocks is individually configured to sequentially transfer substrates from upstream side modules to downstream side modules to process the substrates; a plurality of main transfer mechanisms, each of which is provided on the substrate transfer path, wherein the plurality of main transfer mechanisms is configured to transfer, independently from one another, the substrates among the plurality of modules; a loading and unloading transfer mechanism configured to deliver the substrates between a carrier accommodating the substrates and each of the unit blocks so as to load and unload the substrates with respect to each of the unit blocks; a memory configured to store substrate transfer history for each of the unit blocks; and a setting part configured to update a cycle time, which is a time required for a corresponding one of the main transfer mechanisms to move around the substrate transfer path once, of each of the unit blocks based on the substrate transfer history, and configured to set a transfer schedule of the substrates in each of the unit blocks based on the updated cycle time.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
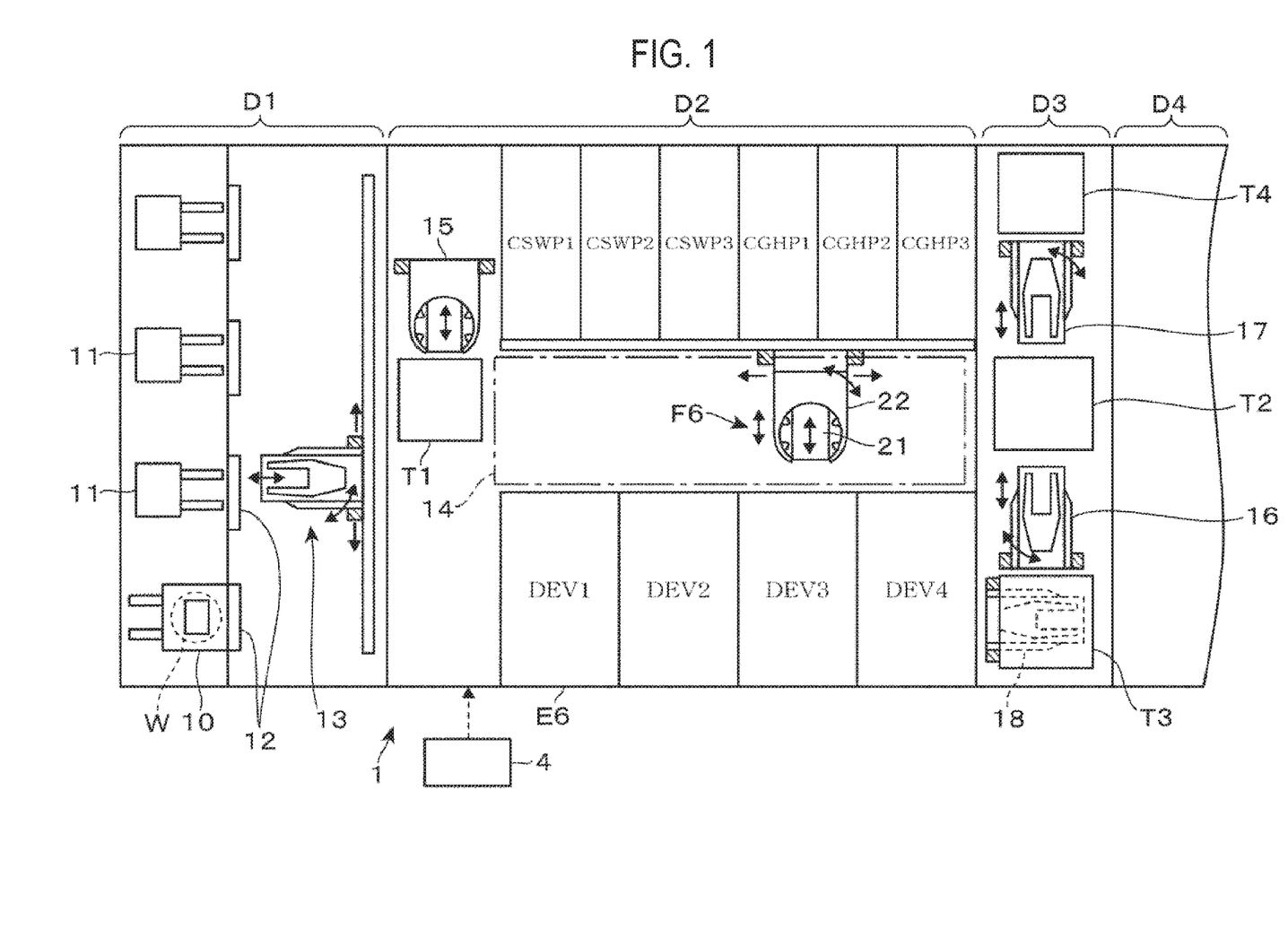
FIG. 1 is a plan view of a coating and developing apparatus according to an embodiment of the present disclosure.
Figure 2:
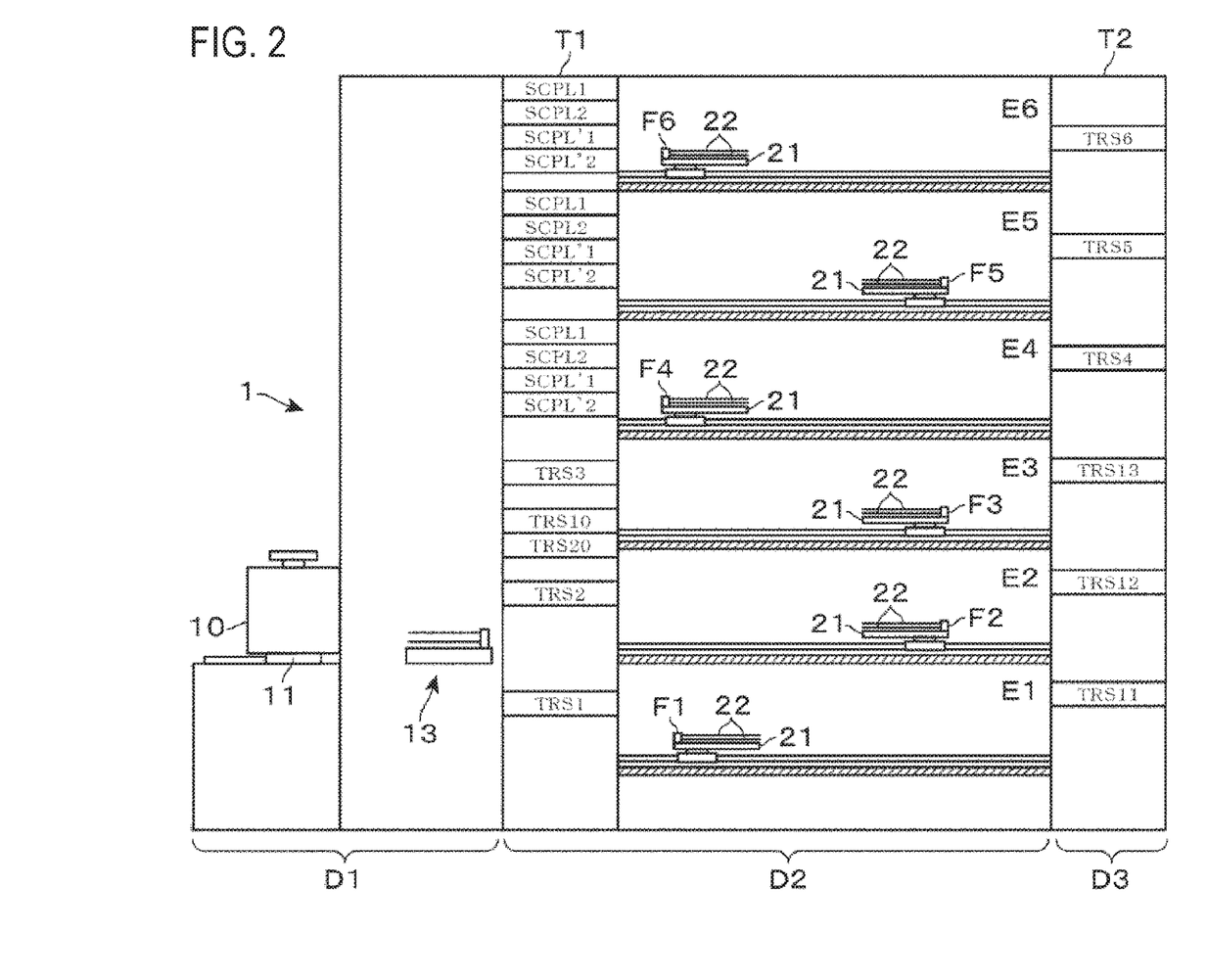
FIG. 2 is a vertical sectional side view of the coating and developing apparatus.

A coating and developing apparatus 1 according to an embodiment of a substrate processing apparatus of the present disclosure will be described with reference to a plan view in FIG. 1 and a vertical sectional side view in FIG. 2. The coating and developing apparatus 1 is configured by connecting a carrier block D1, a processing block D2, and an interface block D3 partitioned from one another in this order from front to rear. An exposure device D4 is connected at the rear side of the interface block D3. The carrier block D1 is provided with a stage 11 for a carrier 10 storing multiple sheets of wafers W, an opening and closing part 12, and a transfer mechanism 13 configured to transfer the wafers W from the carrier 10 via the opening and closing part 12.

The processing block D2 is configured by stacking unit blocks E1 to E6, each of which is configured to perform a liquid process and a heating process on the wafers W, in this order from bottom up, and the unit blocks E1 to E6 are partitioned from one another. In this example, the unit blocks E1 to E3 are configured to be similar to one another, and perform a liquid process of forming an antireflection film by applying a chemical liquid and forming a resist film by applying a resist. In addition, the unit blocks E4 to E6 are configured to be similar to one another, and perform a liquid process of forming a resist pattern by a development process. In each unit block E (E1 to E6), the wafers W are transferred and processed in parallel with one another.

As a representative of the unit blocks E1 to E6, unit block E6 illustrated in FIG. 1 will be described. A transfer path 14 for wafers W extends in a front-rear direction at the center of the unit block E6 in a left-right direction. Four developing modules are provided on one of the left and right sides of the transfer path 14, and the developing modules are indicated as DEV1 to DEV4, respectively. On the other side of the transfer path 14, a plurality of heating modules, each of which includes a heating plate configured to heat the wafer W placed thereon, is arranged in the front-rear direction. A temperature of the heating plate, i.e., a heating temperature of the wafer W, can be changed. As the heating modules, CSWP1 to CSWP3 configured to perform a post exposure bake (PEB) process, which is a heating process performed after an exposure process and before a development process, and CGHP1 to CGHP3 configured to perform a heating process after a development process are provided.

A transfer arm F6 configured to transfer the wafer W in the unit block E6 is provided in the transfer path 14. The transfer arm F6 includes a base 21 capable of moving up and down, moving forward and backward, and rotating around a vertical axis on the transfer path 14. Two substrate holders 22, each of which is capable of supporting the wafer W, are provided on the base 21, and the substrate holders 22 are capable of advancing and retreating with respect to the base 21 independently from each other. As will be described later, when a wafer W is transferred to a module on a downstream side of a transfer flow, one of the substrate holders 22 may receive a wafer W from the module by advancing and retreating, and subsequently, the other one of the substrate holders 22 may enter the module to transfer the wafer W held thereby to the module. That is, it is possible to transfer the wafers W so as to replace the wafer W in the module, and such transfer is referred to as a replacement transfer. A module is a place where the wafer W is placed, and a module that performs a process on the wafer W may be described as a processing module.

The unit blocks E1 to E3 will be described focusing on differences from the unit block E6. Each of the unit blocks E1 to E3 includes an antireflection film forming module and a resist film forming module, instead of the developing modules DEV (DEV1 to DEV4). The resist film forming module supplies a resist as a chemical liquid to the wafer W so as to form the resist film. The antireflection film forming module supplies a chemical liquid for forming the antireflection film to the wafer W so as to form the antireflection film. The unit blocks E1 to E3 are provided with heating modules for heating the wafers W after the formation of the antireflection film and after the formation of the resist film, respectively, instead of the heating modules CSWP (CSWP1 to CSWP3) and CGHP (CGHP1 to CGHP3). In FIG. 2, the transfer arms of the unit blocks E1 to E5, which correspond to the transfer arm F6, are indicated as F1 to F5, respectively, and the transfer arms F1 to F6 serving as main transfer mechanisms are configured to be similar to one another.

On the carrier block D1 side in the processing block D2, there is provided a tower T1 that extends vertically across the unit blocks E1 to E6 and includes a plurality of modules stacked together. The tower T1 is provided with transfer modules TRS10, TRS20, and TRS1 to TRS3, temperature adjustment modules SCPL1 and SCPL2, and temperature adjustment modules SCPL'1 and SCPL'2.

The transfer modules TRS1 to TRS3 are provided at heights to which the transfer arms F1 to F3 are accessible, respectively. The temperature adjustment modules SCPL (SCPL1 and SCPL2) and SCPL' (SCPL'1 and SCPL'2)) are provided at heights to which the transfer arms F4, F5, and F6 are accessible. Each of the temperature adjustment modules SCPL and SCPL' has a stage configured to cool the wafer W placed thereon for temperature adjustment. Temperature adjustment modules to which the wafers W are transferred from the heating modules CSWP are indicated as SCPL, and temperature adjustment modules to which the wafers W are transferred from the heating modules CGHP are indicated as SCPL'. The temperature adjustment modules SCPL' are unloading modules, on which the wafers W processed in the unit blocks E4 to E6 are placed, for unloading the wafers W from the unit blocks E4 to E6. In the vicinity of the tower T1, there is provided a transfer mechanism 15, which is capable of moving up and down to access the individual modules constituting the tower T1.

Next, the interface block D3 will be described. The interface block D3 includes towers T2 to T4 extending vertically across the unit blocks E1 to E6. In the tower T2, a plurality of transfer modules TRS is provided in a stacked manner. The transfer modules TRS are provided at heights corresponding to the unit blocks E1 to E6, respectively. The transfer modules having heights corresponding to the unit blocks E1 to E3 are indicated as TRS11 to TRS13, respectively, and the transfer modules having heights corresponding to the unit blocks E4 to E6 are indicated as TRS4 to TRS6, respectively. The transfer modules TRS4 to TRS6 are loading modules for loading the wafers W into the unit blocks E4 to E6, respectively.

The towers T3 and T4 are provided so as to sandwich the tower T2 therebetween from left and right. Although various modules are included in the towers T3 and T4, illustration and description thereof are omitted. The interface block D3 includes transfer mechanisms 16 to 18 that transfer the wafers W with respect to the towers T2 to T4, respectively. The transfer mechanism 16 is a transfer mechanism that may be moved up and down to deliver the wafers W with respect to the tower T2 and the tower T3, and the transfer mechanism 17 is a transfer mechanism that may be moved up and down to deliver the wafers W with respect to the tower T2 and the tower T4. The transfer mechanism 18 is a transfer mechanism that delivers the wafers W between the tower T2 and the exposure device D4. The transfer mechanisms 13, 15, and 16 to 18 constitute a loading and unloading transfer mechanism for delivering the wafers W between the carrier 10 and the processing block D2.

As will be described later, a transfer route of the wafers W in the coating and developing apparatus 1 is specified by a transfer recipe. Hereinafter, an example of the transfer route will be described. The wafers W are transferred from the carrier 10 to the transfer module TRS10 of the tower T1 by the transfer mechanism 13. The wafers W are allocated from the transfer module TRS10 to the transfer modules TRS1 to TRS3 by the transfer mechanism 15. Then, the wafers W are introduced into the unit blocks E1 to E3 from the transfer modules TRS1 to TRS3 by the transfer arms F1 to F3, respectively, and are transferred in the following order: the antireflection film forming module→the heating module→the resist film forming module the heating module. As a result, the antireflection film and the resist film are sequentially formed on the wafers W. Then, the wafers W are transferred to the transfer modules TRS11 to TRS13, and are transferred to the exposure device D4 by the transfer mechanisms 16 and 18. Thus, the resist film is exposed along a predetermined pattern.

The wafers W after the exposure process are taken out of the exposure device D4 by the transfer mechanism 18, and are received by the transfer mechanism 17 through the modules of the tower T4. The transfer mechanism 17 repeatedly transfers the wafers W in the order of the transfer modules TRS4, TRS5, and TRS6, and allocates the wafers W to these transfer modules. Then, the wafers W transferred to the transfer modules TRS4 to TRS6 are transferred by the transfer arms F4 to F6, respectively, in the following order: the heating module CSWP→the temperature adjustment module SCPL→the developing module DEV→the heating modules CGHP→the temperature adjustment module SCPL'. Thus, the PEB process, the temperature adjustment, the development process, and the temperature adjustment are sequentially performed on the resist films formed on the wafers W. Thereafter, the wafers W are unloaded from the unit blocks E4 to E6 and transferred to the transfer module TRS20 by the transfer mechanism 15, and returned to the carrier 10 by the transfer mechanism 13. Although the transfer route through which the wafers W are transferred to all of the unit blocks E1 to E6 has been illustrated, the wafers W may be processed without being transferred to some of the unit blocks E1 to E6 depending on a transfer recipe in use.

When the wafers W are transferred as described above, a plurality of modules having the same transfer order in one unit block E is referred to as a multi-module. Accordingly, the developing modules DEV1 to DEV4 constitute one multi-module, the temperature adjustment modules SCPL1 and SCPL2 constitute another multi-module, and the temperature adjustment modules SCPL'1 and SCPL'2 constitute a different multi-module. In addition, the heating modules CSWP1 to CSWP3 constitute a multi-module, and the heating modules CGHP1 to CGHP3 constitute a separate multi-module. Each process in the above-described transfer flows may be described as a step. That is, respective modules constituting a multi-module are modules that perform the same step.

In addition, in one unit block E, the number of transfer operations of the transfer arm F between modules for different steps is defined as the number of processes of the transfer arm F. In the above-described exemplary transfer route, with respect to the unit block E6, since the transfer operation is performed four times in the following order: the heating module CSWP→the temperature adjustment module SCPL→the developing module DEV→the heating module CGHP→the temperature adjustment module SCPL', the number of processes is 4. In addition, since the transfer route is set as described above, the heating module CSWP and the temperature adjustment module SCPL correspond to upstream side modules, and the developing module DEV and the heating module CGHP correspond to downstream side modules.

The wafers W stored in the carrier 10 and transferred to the coating and developing apparatus 1 are managed by a process job (PJ) set by a controller 4 (described later) provided in the coating and developing apparatus 1. The PJ is information that specifies a transfer recipe and wafers W to be transferred into the coating and developing apparatus 1. The wafers W set by the same PJ are wafers W of the same lot and are subjected to the same type of process. Setting of the PJ includes setting of a transfer schedule to be described later. When the transfer operations based on the transfer schedule is terminated, the PJ is terminated.

The transfer recipe is data that specifies processing content of each module, a transfer order of wafers W between different types of modules, and modules to be used. Each transfer recipe is given a name for management. The processing content of each module is information for operating constituent components of the module to perform a process on the wafers W. More specifically, the processing content includes a time required for operation of the constituent components of the module, a heating temperature when heating the wafers W, a timing and order of supplying liquids to the wafers W when performing a liquid process on the wafers W, and the like. In order to specify the processing contents of the modules and the transfer order of the modules as described above, the transfer recipe specifies processes of the wafers W, which are performed in the unit blocks E1 to E6, respectively. In addition, by specifying the transfer order, the transfer recipe also specifies the numbers of processes of the transfer arms F1 to F6.

Specifying a module to be used included in the transfer recipe is specifying which of a plurality of modules constituting a multi-module will be used. In the following description, it is assumed that all modules constituting a multi-module are used for processing wafers W for convenience. That is, as for the developing modules DEV of the unit block E6, DEV1 to DEV4 are all used. The number of modules performing the same step in one unit block E is defined as the number of available modules. For example, as for the developing modules DEV of the unit block E6, since four modules of DEV1 to DEV4 are used as described above, the number of available modules is four. Since the transfer recipe specifies the modules to be used as described above, the transfer recipe also specifies the number of available modules.

Various calculations are performed by the controller 4 (to be described later) based on the transfer recipe such that a processing time and an overhead time (OHT) of a wafer W in each module are obtained. The OHT is the sum of a time required from loading a wafer W into the module to processing the wafer W and a time required until it becomes possible to unload the wafer W from the module after processing the wafer W. The sum of the processing time and the OHT of the wafer W in the module is a stay time (module using time (MUT)) that is at least required for the wafer W to stay in the module, and the MUT is also calculated.

For example, wafers W of different lots are stored in different carriers 10, and when delivery of wafers W from one carrier 10 is terminated, delivery of wafers W from a subsequent carrier 10 is performed. In the coating and developing apparatus 1, the wafers W loaded into the apparatus are sequentially transferred toward the downstream side. That is, the transfer is performed such that a wafer W loaded later does not move to a downstream side module earlier than a wafer W loaded at an earlier time. Accordingly, in each unit block E, wafers W of the same lot are collected, that is, wafers W of the same PJ are collectively loaded.

The transfer arms F (F1 to F6) perform a cyclic transfer in which the transfer arms F (F1 to F6) sequentially and cyclically move between the modules to be accessed in the unit blocks E (E1 to E6), respectively, and the wafers W are delivered sheet by sheet from the upstream side module to the downstream side module. That is, in the case of the unit block E6, the transfer arm F6 repeatedly moves around the transfer path 14, such that transfer of a wafer W directed from the side of the transfer module TRS6, which is a loading module for the unit block E6, to the side of the temperature adjustment module SCPL', which is an unloading module, is repeatedly performed. A time required for the transfer arm F to move around the transfer path 14 once is defined as a cycle time (CT). As defined above, the CT has a value corresponding to the throughput of the unit block E. Then, the transfer schedule is created by assigning an order to the wafers W, associating the order of the wafers W with modules as transfer destinations, and arranging data specifying cycles performed by the transfer arms F in time series. Wafers W are transferred into the coating and developing apparatus 1 according to the transfer schedule created in advance before being loaded into the coating and developing apparatus 1.

Figure 3:
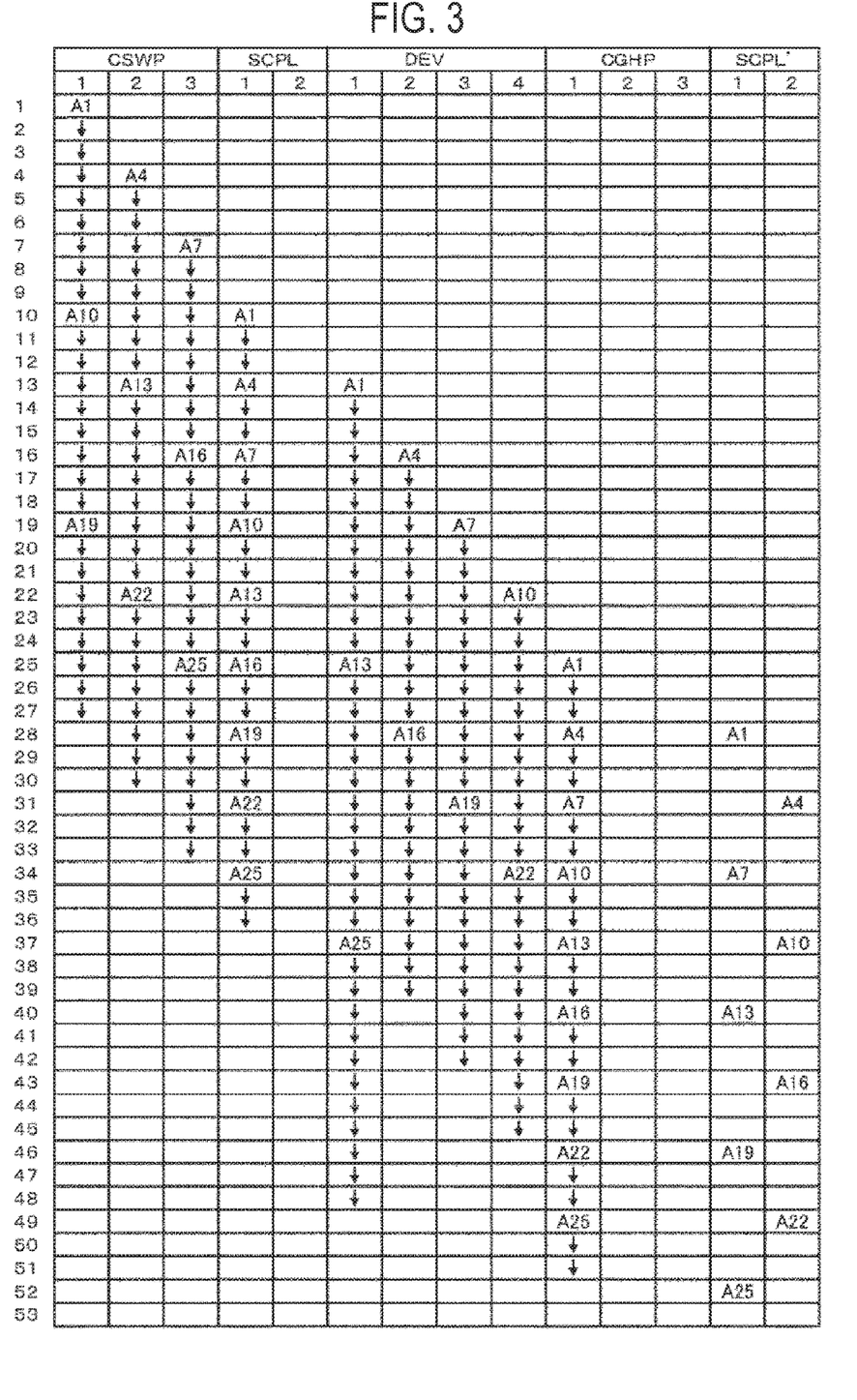
FIG. 3 illustrates an example of a transfer schedule.

FIG. 3 shows an example of the transfer schedule of the wafers W transferred in the unit block E6. The transfer schedule shown as a table in this way will be described. One row of cells arranged in the horizontal direction represents one cycle, and the lower cell in the table indicates the later cycle. A row of cells arranged in the vertical direction represents modules to which the wafers W are transferred. A wafer W to be transferred, a cycle when the wafer W is transferred, and a module to which the wafer W is transferred and in which the wafer W stays are indicated by an ID number written in a cell and arrows extending downward from the ID number.

Specifically, when viewed in time series, a wafer W is transferred to a module in a cycle of a cell to which an ID number is assigned, and stays in the module throughout a cycle corresponding to a cell to which an arrow is assigned. Then, the wafer W is unloaded from the module in a cycle of a cell, which is located just below a cell to which an arrow is assigned, and to which no arrow is assigned. The number of cycles in which the wafer W stays in the module is defined as the number of stay cycles of the wafer W in the module. More specifically, in the table of the transfer schedule, the number of stay cycles is as follows: the number of a cell to which an ID number is assigned (=1)+the number of cells, which are located below the cell to which the ID number is assigned, and to which arrows are assigned.

For example, from FIG. 3, with respect to the temperature adjustment module SCPL, since two cells to which arrows are assigned are disposed below a cell to which an ID number is assigned, the number of stay cycles in the heating module CSWP is three. The English letter in the cells represents a PJ set on the wafers W, and the numbers represent an order of loading into the unit block E6 in the PJ. In the following description, an ID number may be used when referring to each wafer W. FIG. 3 shows a transfer schedule of a transfer recipe, which is set to allocate and transfer wafers A1 to A25 to the unit blocks E4 to E6. Therefore, only some of the wafers A1 to A25 are indicated in the transfer schedule of FIG. 3.

Although the wafers W of each PJ are sequentially transferred into the unit block E, FIG. 3 shows a transfer schedule of PJ-A, that is, wafers W of only one PJ. The transfer schedule shown in FIG. 3 is a transfer schedule showing operation of the transfer arm F6. With respect to SCPL', which is the unloading module from the unit block E6, the transfer arm F6 only performs a loading process, and the unloading process of the wafers W from the SCPL' is performed by another transfer mechanism. Therefore, the number of stay cycles in SCPL' is set to one by counting only a cycle required for each wafer W to be loaded into SCPL'.

As will be described later, the transfer schedule is set based on a CT of the transfer arm F. When the CT is too long, the transfer schedule is set such that a waiting time until the transfer arm F accesses a module and unloads a wafer W from the module after a process on the wafer W is completed and the wafer W is ready to be unloaded from the module (hereinafter referred to as a post-waiting time) becomes too long. As a result, the throughput of the apparatus is reduced. In contrast, when the CT is too short, although the post-waiting time can be suppressed, the number of cells arranged in the vertical direction shown in FIG. 3 increases and the data of the transfer schedule becomes large. As a result, a large-capacity memory is required to store the transfer schedule, which is not practical. Accordingly, it is necessary to set the CT to an appropriate value.

In addition, in setting the CT as illustrated in a specific example later, when the CT is set to be uniform for the respective unit blocks E, the CT may be set to be inappropriate for processes to be performed, and thus, some of the unit blocks E may have a long post-waiting time in the unloading modules. Accordingly, the controller 4 provided in the coating and developing apparatus 1 individually resets (updates) the CTs of the unit blocks E1 to E6 and creates transfer schedules for the unit blocks E based on the reset CTs.

Resetting the CT will be described. The previous transfer history data of wafers W for each unit block E is stored in a memory of the controller 4. Specifically, as a transfer history of wafers W, the number of wafers W (the number of transferred wafers), which have passed through the unit block E by each transfer recipe, is stored. Meanwhile, from each transfer recipe, the CT corresponding to the transfer recipe (for convenience of description, referred to as a "standard CT") may be calculated. That is, the number of transferred wafers W is stored in the memory in association with the standard CT. From the data in the memory, the CT is reset based on the standard CT corresponding to a transfer recipe having a relatively large number of transferred wafers W. That is, very roughly describing, for each of the unit blocks E1 to E6, assuming that a transfer recipe, which has been relatively frequently used in the past, will be frequently used in the future, a cycle time is reset to be appropriate for the transfer recipe. Before a transfer history sufficient for performing the resetting is obtained, for example, an arbitrary CT is set to operate the apparatus, and the resetting is performed at an appropriate timing when the transfer history is sufficiently accumulated.

Hereinafter, a method of calculating the standard CT, which is a time parameter for calculating a cycle time, will be described. As described above, modules to be used are specified in the transfer recipe. The MUTs described above for the modules to be used are calculated, and division values are obtained by dividing the MUTs by the number of available modules, respectively. For example, it is assumed that the MUT of the developing modules DEV of the unit block E6 is 47.0 seconds. Since the number of available modules in the developing modules DEV is four, 11.75 seconds (47.0 seconds/4) is a division value for the DEV. Similarly, a division value is calculated for each module of the unit blocks E1 to E6, and the maximum of the division values is set as a first candidate value of the standard CT. In addition, for each unit block E, (the number of processes of the unit block E)×(a predetermined time) is calculated. For example, for the unit block E6, since the number of processes is four as described above, the calculated value is 14.8 seconds when the predetermined time is, for example, 3.7 seconds. Then, the maximum of the values obtained by calculating (the number of processes for each unit block E)×(a predetermined time) is set as a second candidate value of the standard CT.

Then, the larger one of the first candidate value and the second candidate value of the standard CT is determined as the standard CT. That is, when a process in a module in any step of the unit block E causes a bottleneck of the throughput in the processing block D2, the standard CT is set according to the step. On the contrary, when the number of processes of any transfer arm F of the unit block E causes a bottleneck of processes in the processing block D2, the standard CT is set according to the number of processes of the transfer arm F.

Figure 4:
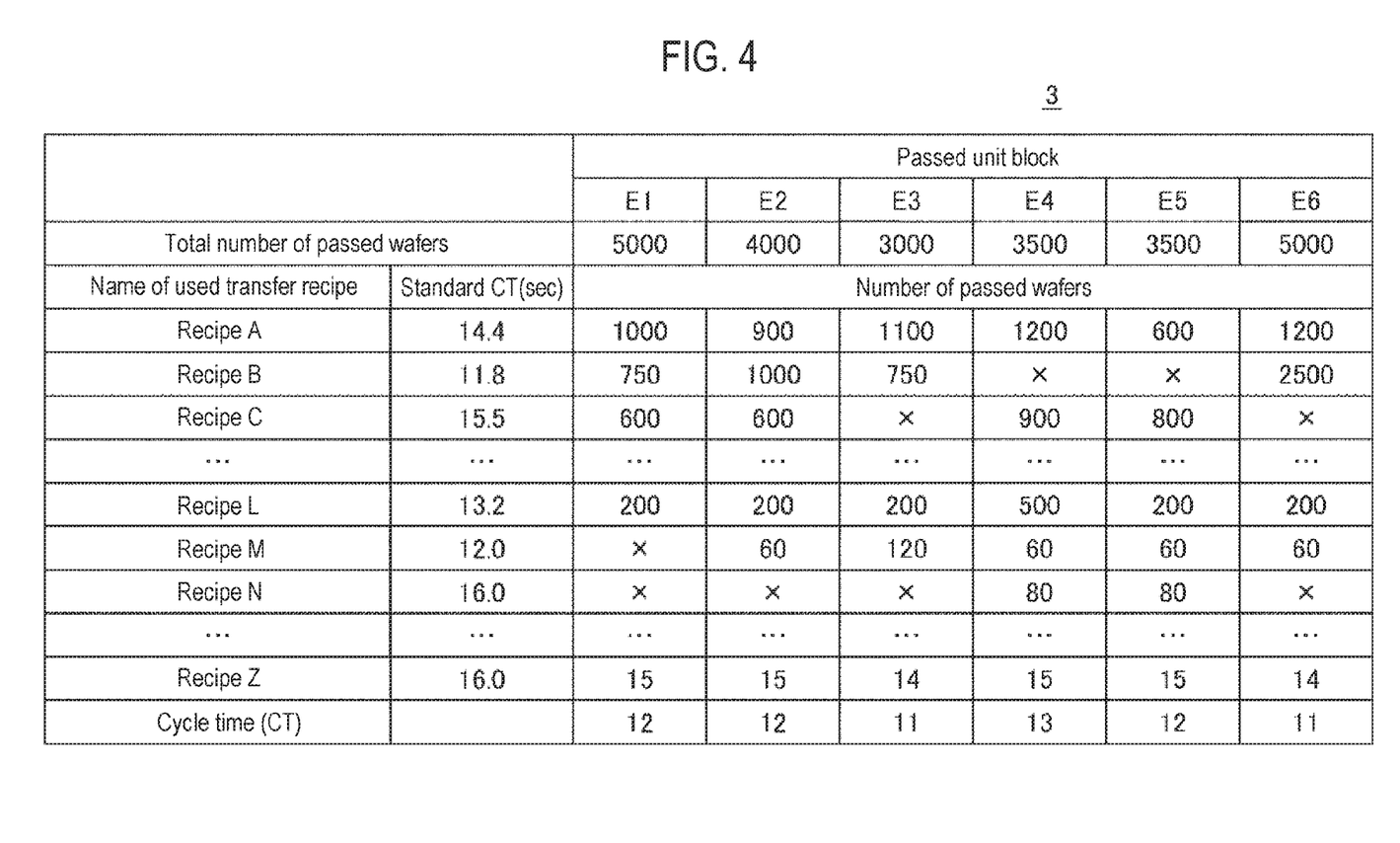
FIG. 4 illustrates a table used for calculating a cycle time for setting the transfer schedule.

Next, configuration of the memory for storing the number of transferred wafers W will be described in detail. A transfer data table 3 shown in FIG. 4 is stored in the memory. In the transfer data table 3, names of transfer recipes (the names are A to Z in the example in the drawing) are stored, and for each unit block E, the numbers of transferred wafers W are stored in association with the names of the transfer recipes. In addition, in the transfer data table 3, for each unit block E, the sum of the numbers of transferred wafers W in association with the transfer recipes is stored as the total number of passed wafers W. Further, in the transfer data table 3, the reset CT for each unit block E is stored, and the above-described standard CT calculated from each transfer recipe is stored in association with the name of the transfer recipe.

A procedure for resetting the CT based on the data stored in the transfer data table 3 will be described. First, in a unit block for which the cycle time is to be calculated, the maximum of the numbers of passed wafers W corresponding to respective transfer recipes is selected, and it is determined whether or not the selected number exceeds the number of wafers having a preset ratio with respect to the total number of passed wafers W of the unit block (hereinafter, referred to a "set ratio number of sheets"). When the selected number does not exceed the set ratio number of sheets, the second largest one among the numbers of passed wafers corresponding to respective transfer recipes is also selected, and the selected numbers of passed wafers W are added to each other. That is, the first largest number of passed wafers W and the second largest number of passed wafers W are added to each other. Then, it is determined whether or not the added number of passed wafers exceeds the set ratio number of sheets. When the added number of passed wafers does not yet exceed the set ratio number of sheets, the third largest one among the numbers of passed wafers corresponding to respective transfer recipes is also selected, and the selected numbers of passed wafers W are added to one another. That is, the first largest number of passed wafers W, the second largest number of passed wafers W, and the third largest number of passed wafers W are added to one another. Then, it is determined whether or not the added number of passed wafers exceeds the set ratio number of sheets.

The above-described selection of the numbers of passed wafers W in order from the largest one, and comparison of the added value of the selected numbers of passed wafers W with the set ratio number of sheets are repeated until it is determined that the added number of passed wafers exceeds the set ratio number of sheets. When it is determined that the added number of passed wafers exceeds the set ratio number of sheets, the number of passing wafers W is not newly selected, and the transfer recipes associated with the already selected numbers of passed wafers W are determined as the transfer recipes for CT calculation. Then, the shortest one is selected from the standard CTs corresponding to the transfer recipes to be calculated. In addition, integer conversion is performed on the selected standard CT. This integer conversion is performed by rounding down the numerical value below the decimal point of the selected minimum standard CT. The standard CT that has been subjected to the integer conversion is determined as a CT. Such a determination of CT is performed for each unit block.

Figure 5:
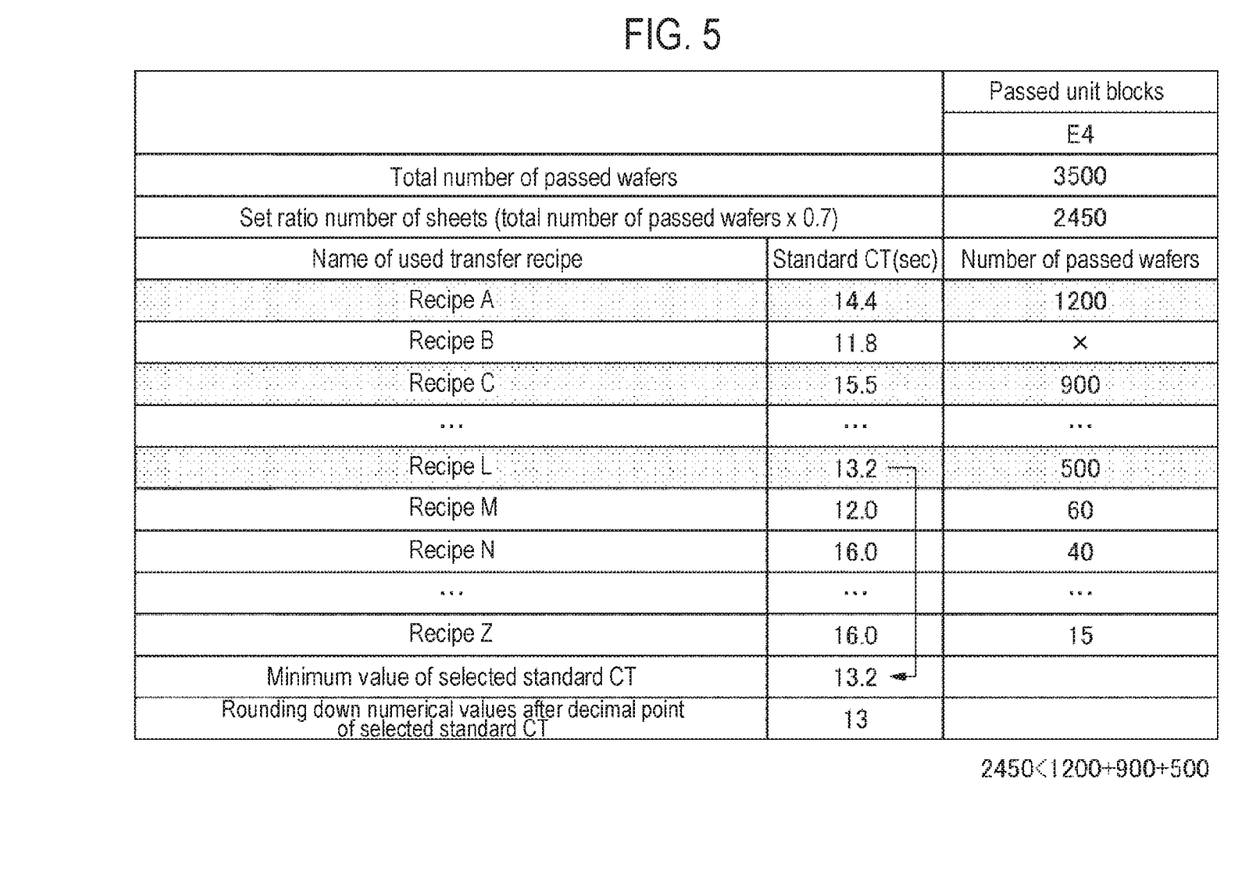
FIG. 5 illustrates a part of the table.

Specifically, a CT calculation procedure in the unit block E4 will be described. In this description, FIG. 5 illustrating data relating to the unit block E4 extracted from FIG. 4 is also appropriately referred to. For example, it is assumed that the preset ratio to the total number of passed wafers W is 70%, and as shown in FIGS. 4 and 5, the total number of passed wafers of the unit block E4 is 3,500 sheets. That is, the above-mentioned set ratio number of sheets is 2,450 sheets (3,500×0.7=2,450 sheets). Then, it is assumed that 1,200 sheets of wafers are transferred by the transfer recipe A, 0 sheets of wafers are transferred by the transfer recipe B, and 900 sheets of wafers are transferred by the transfer recipe C. In addition, it is assumed that 500 sheets of wafers are transferred by the transfer recipe L, 60 sheets of wafers are transferred by the transfer recipe M, 40 sheets of wafers are transferred by the transfer recipe N, and 15 sheets of wafers are transferred by the transfer recipe Z. Although the numbers of passed wafers W transferred by transfer recipes other than the transfer recipes A to C, L to N, and Z are not shown, it is assumed that each of the numbers is less than 60 sheets. The standard CTs of the transfer recipes A, B, C, L, M, N, and Z are 14.4 seconds, 11.8 seconds, 15.5 seconds, 13.2 seconds, 12.0 seconds, 16.0 seconds, and 16.0 seconds, respectively.

Among the numbers of passed wafers W corresponding to the transfer recipes, the first largest one is 1,200 sheets, and this 1,200 sheets is selected and compared with 2,450 sheets, which is the set ratio number of sheets. Since the selected 1,200 sheets does not exceed the set ratio number of sheets, 900 sheets, which is the second largest number of passed wafers, is also selected. Then, 2,100 sheets, which is a value obtained by adding 1,200 sheets and 900 sheets selected as described above, is compared with the set ratio number of sheets. Since the added value of 2,100 sheets does not exceed the set ratio number of sheets, 500 sheets, which is the third largest number of passed wafers, is also selected. Then, 2,600 sheets, which is a value obtained by adding 1,200, 900, and 500 sheets selected as described above, is compared with the set ratio number of sheets. Since this added value exceeds the set ratio number of sheets, additional selection of the number of passed wafers W is not performed.

Then, the transfer recipes A. C. and L associated with 1,200, 900, and 500 sheets, which are the selected number of passed wafers W, respectively, are selected as the transfer recipes for CT calculation. In FIG. 5, cells in the table in which the numbers of wafers W selected as described above, the selected transfer recipes, and the standard CTs corresponding to the selected transfer recipes are described are indicated with gray scale. Subsequently, 13.2 seconds of the transfer recipe L is selected as the shortest standard CT among the standard CTs of 14.4 seconds, 15.5 seconds, and 13.2 seconds corresponding to the selected transfer recipes A, C, and L, respectively. Subsequently, integer conversion is conducted on the 13.2 seconds to round down numerical values after the decimal point, and the obtained 13 seconds is determined as the CT of the unit block E4.

The reason for determining the CT as described above will be described. When determining transfer recipes to be subjected to the CT calculation described above, for example, it is conceivable that a predetermined number of transfer recipes are selected in descending order of the number of passed wafers W. For example, it is conceivable that five transfer recipes are selected in descending order of the number of passed wafers and used as the transfer recipes for CT calculation. However, in this case, when the number of passed wafers W is greatly biased among the transfer recipes, there is a concern that a CT is determined based on the standard CTs of the transfer recipes having a very small number of passed wafers, resulting in a CT according to a less frequently used transfer recipe. More specifically, it is conceivable that the transfer is performed such that among the transfer recipes, a transfer recipe having the largest number of passed wafers has 3,000 sheets and the transfer recipe having the next largest number of wafers has five sheets, and that the transfer recipe having the number of passed wafers of five is selected as the transfer recipe for CT calculation. When a CT is set based on the standard CT of the transfer recipe having the number of passed wafers of five, the CT does not correspond to transfer recipes expected to be used relatively frequently, as described above. Therefore, as described above, it is desirable to determine the transfer recipes for CT calculation by comparing the sum of the numbers of wafers W, which is obtained by sequentially selecting transfer recipes in descending order of the number of passed wafers W, and the set ratio number of sheets.

However, the present disclosure is not limited to selecting transfer recipes for CT calculation based on the comparison with the set ratio number of sheets as described above. For example, only one transfer recipe having the largest number of passed wafers W may be selected as a transfer recipe for CT calculation, and the standard CT of the transfer recipe may be subjected to integer conversion to calculate a CT. Accordingly, for example, at least a transfer recipe that has the largest number of passed wafers W is selected as the transfer recipe for CT calculation.

In the above example, the shortest standard CT is selected after selecting the transfer recipes for CT calculation. However, the present disclosure is not limited to selecting the standard CT in this way. For example, an average of the standard CTs of the selected transfer recipes to be calculated may be acquired, and the average may be subjected to integer conversion to determine a CT. Alternatively, for example, a standard deviation of the standard cycle time of the selected transfer recipes to be calculated may be acquired, and an arbitrary value within a range of (the average−the standard deviation) to (the average+the standard deviation) may be determined as a CT. However, it is desirable to select the minimum standard CT as described above, because the module waiting time can be suppressed and the throughput of the unit block E can be improved, as described above.

The above-described integer conversion is performed in order to prevent the calculation from becoming complicated when setting a transfer schedule based on a cycle time. Therefore, in the integer conversion, for example, the numerical values after the decimal point may be rounded up or rounded off without being limited to being rounded down. However, as described above, in order to reduce the waiting time after processing a wafer W in a module, it is advantageous to use the shorter cycle time. In addition, the data volume of the transfer schedule does not change significantly due to a slight change in the numerical values after the decimal point (the number of cells in the vertical direction in the transfer schedule table does not increase significantly). Accordingly, as the integer conversion, it is desirable to round down the values after the decimal point, as described above.

Next, the controller 4, which is a computer provided in the coating and developing apparatus 1, will be described with reference to FIG. 6. The controller 4 serving as a setting part for setting a transfer schedule includes a memory, which is a non-transitory storage medium, in which the transfer data table 3 described above is stored. In addition, the controller 4 includes a transfer recipe memory 41 in which the transfer recipes are stored, and the above-described standard CT is calculated based on data stored in the memory 41. In addition, the controller 4 includes a data backup memory 42 for the data table 3, which will be described later. The controller 4 further includes an operation part 43 formed by a touch panel or the like, and an operator of the apparatus may perform various operations using the operation part 43. Specifically, for example, the operator may delete data in the data table 3 and the data backup memory 42, which will be described later, and may add, delete, or change the transfer recipes by accessing the memory 41.

Figure 6:
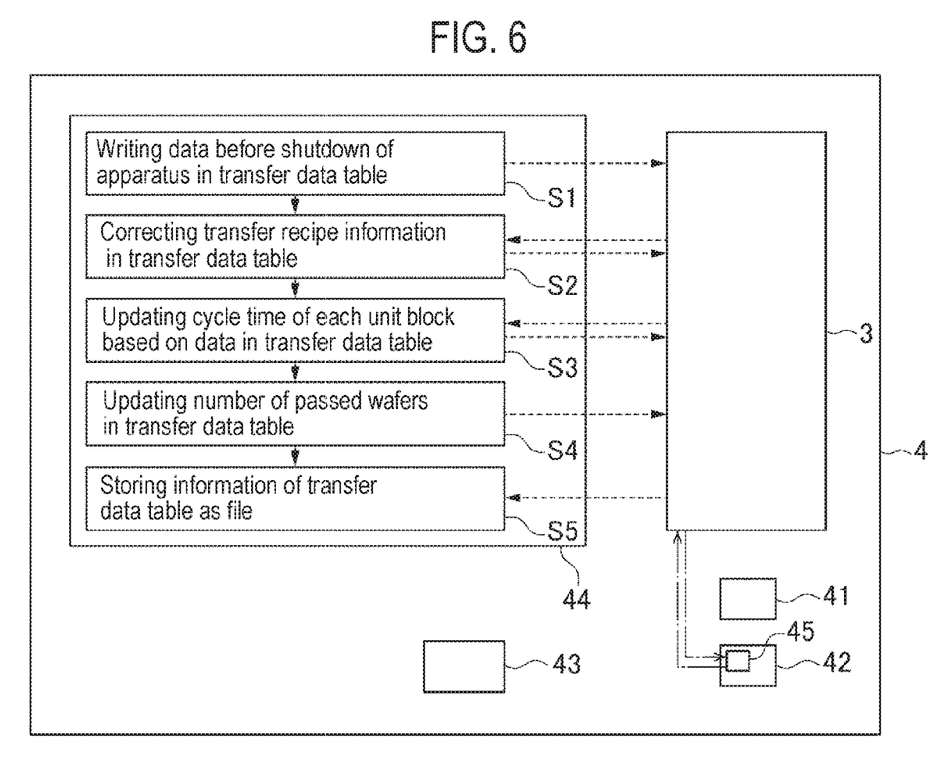
FIG. 6 is an explanatory view showing a controller that stores the table and operations performed by the controller.

In FIG. 6, reference numeral 44 denotes a program. The program 44 is installed in the controller 4 in a state of being stored in a storage medium, such as a compact disc, a hard disc, a memory card, and a DVD. In FIG. 6, processes executed by the program 44 from the start to the shutdown of the coating and developing apparatus 1 are shown in time series as transfer control steps S1 to S5. Among steps S1 to S5, for transfer control steps in which data is written to the transfer data table 3, dotted arrows directed from columns indicating the transfer control steps to the data table 3 are illustrated. For transfer control steps in which data is read from the transfer data table 3, dotted arrows directed from the transfer data table 3 to columns indicating the transfer control steps are illustrated.

The outline of each of steps S1 to S5 will be described. The transfer control step S1 is performed when the coating and developing apparatus 1 is started, and data of a file 45, which has been backed up in the memory 42 before the previous shutdown of the apparatus is written in the transfer data table 3. In the transfer control step S2, the data in the transfer data table 3 is corrected according to the data in the transfer recipe memory 41. In the transfer control step S3, the resetting of CT described with reference to FIGS. 4 and 5 is performed. In the transfer control step S4, the number of passed wafers W in the transfer data table 3 is updated according to the transfer result of the wafers W in the apparatus. In the transfer control step S5, the data of the transfer data table 3 when the coating and developing apparatus 1 is shut down is backed up in the memory 42 and stored as the file 45. In the transfer control step S, the data of the file 45 backed up in the transfer control step S5 is written in the transfer data table 3. That is, the transfer history of wafers W before the shutdown of the apparatus is used for resetting the CT.

The transfer control step S2 will be further described. The transfer control step S2 is performed when calculating the CT, that is, immediately before performing the transfer control step S3. In the transfer control step S2, the names of transfer recipes stored in the transfer data table 3 are compared with the names of transfer recipes stored in the transfer recipe memory 41. For example, it is assumed that some transfer recipes are deleted from the transfer recipe memory 41 by the operator before the transfer control step S2 is performed. In this case, data on the some transfer recipes is deleted from the transfer data table 3 through the above-described comparison. Specifically, the names of the transfer recipes, the numbers of passed wafers W corresponding to the transfer recipes, and the standard CTs corresponding to the transfer recipes are deleted from the transfer data table 3. In addition, in accordance with the deletion of the numbers of passed wafers W, the total number of passed wafers W of each unit block in the transfer data table 3 is updated.

Figure 7:
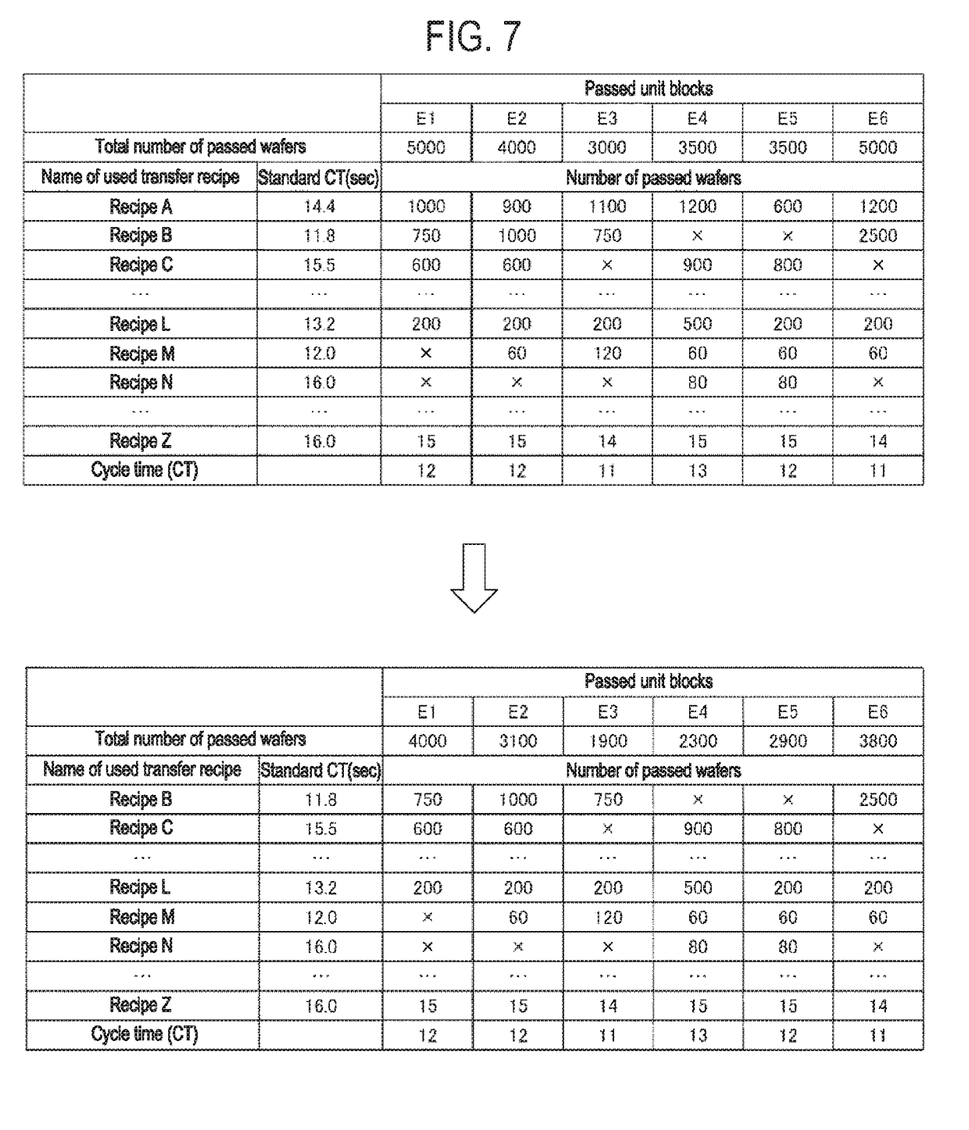
FIG. 7 is an explanatory view illustrating how the table is updated.

FIG. 7 illustrates an example of a state in which, when the transfer recipe A among the transfer recipes A to Z is deleted from the transfer recipe memory 41, data relating to the transfer recipe A is deleted from the transfer data table 3 and updated. When the transfer recipe A is deleted from the memory 41 as described above, the resetting of CT performed in the transfer control step S3 after the transfer control step S2 is performed based on the numbers of passed wafers W for the transfer recipes B to Z. Although the data in the transfer data table 3 may be updated whenever a transfer recipe is deleted, the number of times of data update is suppressed by updating the transfer data table 3 immediately before calculating the CT as described above. This is desirable because processes performed by the controller 4 are reduced.

In the transfer control step S3, the CT is reset based on each data of the transfer data table 3 as described above, and the CT is written in the transfer data table 3. The transfer control step S3 is performed when each of the transfer mechanisms 13, 15, 16 to 18, and F1 to F6 in the coating and developing apparatus 1 is not transferring a wafer W. This is because when the CT is changed while a wafer W is being transferred in the coating and developing apparatus 1, it is necessary to reset the transfer schedule for the wafer W which is being transferred, and such resetting of the transfer schedule during transfer of a wafer W increases the load on the transfer mechanism.

Specifically, for example, after a power is applied to the coating and developing apparatus 1, the transfer control step 53 is performed until the first carrier 10 is loaded into the coating and developing apparatus 1 and a PJ is set for the wafers W within the carrier 10. However, when an interval from termination of transfer of wafers of one PJ in the coating and developing apparatus 1 to loading of subsequent wafers W into the coating and developing apparatus 1 is relatively long, the CT may be reset at this interval. For example, during operation of the apparatus, the operator may issue an instruction from the operation part 43 of the controller 4 to reset the CT while observing a status of the transfer of the carrier 10 to the coating and developing apparatus 1. In addition, for example, when it is expected that the wafer loading interval is relatively long at an arbitrary period during operation of the apparatus, a timer may be set in accordance with the period, and the CT may be reset during the period.

Next, the transfer control step S4 will be described. Whenever a PJ ends, the data in the transfer data table 3 is updated. That is, when the transfer of each wafer W of one PJ according to the transfer schedule is completed, the number of passed wafers W of each unit block E, which are transferred by the transfer recipe of this PJ, is updated. In addition, the total number of passed wafers is updated in accordance with the update of the numbers of passed wafers. However, the update of the numbers of passed wafers is performed for the wafers W for which the transfer have been normally terminated. Accordingly, the number of passed wafers is updated by the number of wafers W transferred from the carrier 10 and returned to the carrier 10. In some cases, a PJ may be set for the purpose of testing a module or a transfer mechanism, rather than for the purpose of processing wafers W described above, but the numbers of passed wafers are not updated by the wafers W transferred in such a PJ.

Figure 8:
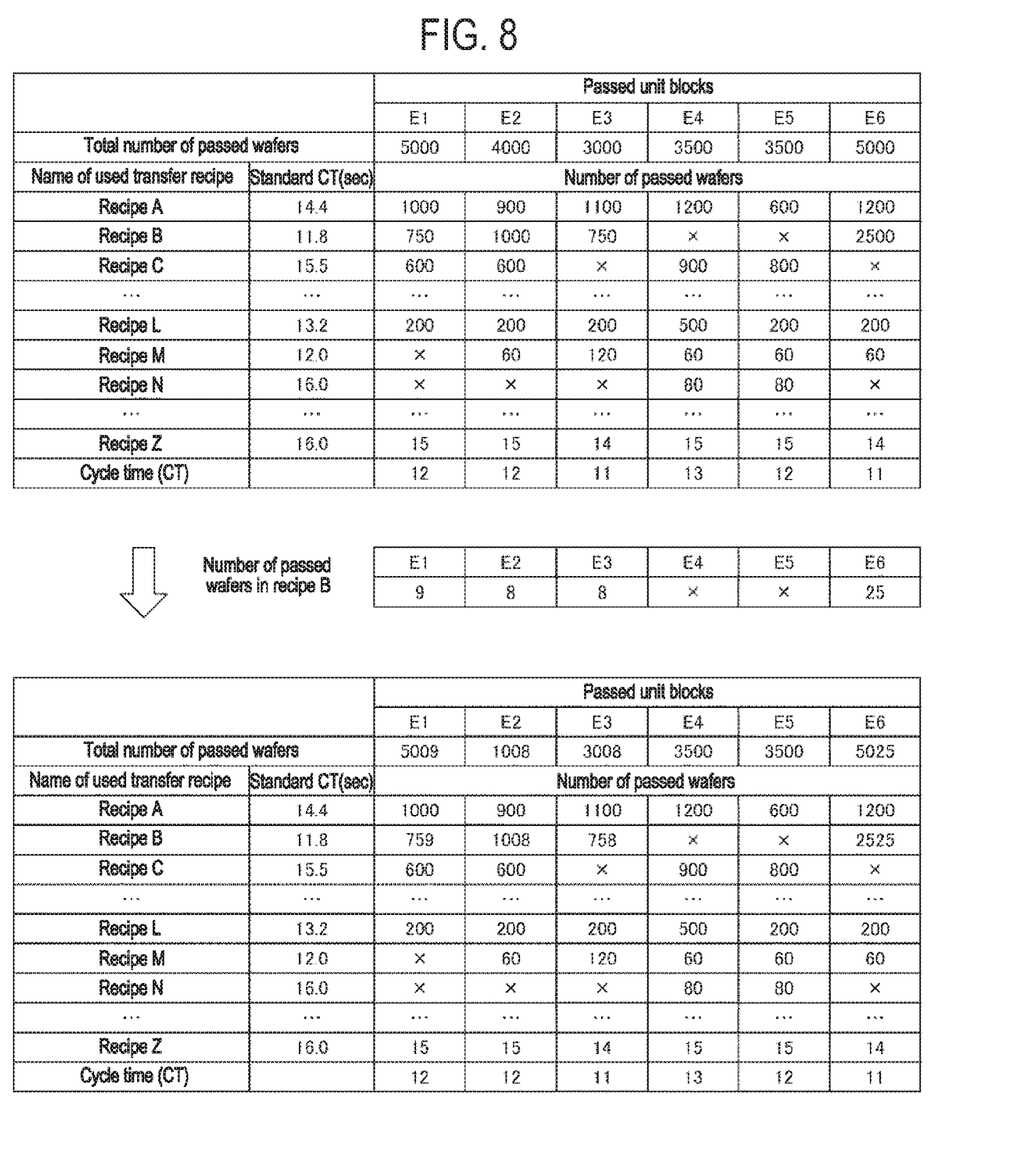
FIG. 8 is an explanatory view illustrating how the table is updated.

For example, it is assumed that a total of 25 sheets of wafers W are transferred to the coating and developing apparatus 1 in PJ-B specifying the transfer recipe B. The PJ-B is not a test PJ described above, but a PJ for processing wafers W. Then, it is assumed that 9, 8, 8, 0, 0, and 25 sheets of wafers W of the PJ-B are transferred to the unit blocks E1, E2, E3, E4, E5, and E6, respectively, and that each wafer W is normally returned to the carrier 10 and the PJ-B is terminated. FIG. 8 illustrates a state in which the transfer data table 3 is updated after the termination of the PJ-B. After the termination of the PJ-B, the numbers of passed wafers W in the unit blocks E1, E2, E3, E4, E5, and E6, which correspond to the transfer recipe B, are increased by 9, 8, and 8, 0, 0, and 25 sheets, respectively, compared to before the termination of the PJ-B. The total numbers of passed wafers W in the unit blocks E1, E2, E3, E4, E5, and E6 also increase by 9, 8, 8, 0, 0, and 25 sheets, respectively. When the transfer by the transfer recipe for which no data is stored in the transfer data table 3 is completed in the transfer control step S4, the transfer data table 3 is updated such that the name of the transfer recipe, the standard CT of the transfer recipe, and the numbers of passed wafers W by the transfer recipe are added.

Since the transfer data table 3 is updated in this manner, resetting the CT in the transfer control step S3 is performed for the PJ which normally terminates the transfer and one or more sheets of wafers W are stored in the carrier 10. Wafers W in a PJ which is stopped before the transfer from the carrier 10 is initiated, or wafers W in a PJ in which the wafers W are collected without being returned to the carrier 10 due to abnormal transfer of all of the wafers W after the transfer of the wafers W is initiated, does not become targets of resetting the CT.

When the operator performs a predetermined operation via the operation part 43 constituting the controller 4, the transfer data table 3 and the data backup memory 42 are initialized, and the data of the transfer data table 3 and the file 45 of the data backup memory 42 are removed. The transfer data table 3 and the data backup memory 42 are configured to be removable as described above in order to prevent the CT from being set based on past data obtained by previous operation when the operation of the apparatus is changed, that is, in order to prevent the CT from being set to be inappropriate for the processes in the unit block E.

Supplemental description on the program 44 will be made. The program 44 includes instructions (respective steps) set to output control signals from the controller 4 based on the set transfer schedule, in addition to perform resetting a CT and setting the transfer schedule based on the CT. Operation of constituent components of the coating and developing apparatus 1 is controlled by the control signals, and wafers W are transferred and processed based on the transfer schedule.

Next, a process of setting a transfer schedule of the PJ-A in the unit block E6 illustrated in FIG. 3 based on a cycle time recalculated as described above will be described. The transfer schedule of FIG. 3 is set such that the replacement transfer described above is performed relatively frequently. The table of the transfer schedule is displayed according to the rules described above. Thus, wafers W are subjected to the replacement transfer when it is displayed that one wafer W stays in a module in a cycle immediately before (one cycle before) a cycle in which the other wafer W is loaded into the module.

The transfer recipe A specified in the PJ-A is set to process wafers W by transferring wafers W to the unit blocks E4 to E6. Therefore, the transfer mechanism 17 that transfers the wafers W to the transfer modules TRS4 to TRS6, which are the loading modules to the unit blocks E4 to E6, operates in synchronization with the cycle times of the unit blocks E4 to E6. Specifically, the transfer mechanism 17 repeatedly and sequentially transfers the wafers W to the transfer modules TRS4 to TRS6 as described above, while transferring one wafer W every cycle time. That is, one wafer W is transferred to each of the unit blocks E4 to E6 every three cycles. The numbers of available modules, processing times, OHTs, and MUTs are determined based on the transfer recipe, as shown in Table 1 below. It is assumed that the reset cycle time is 12 seconds.

TABLE 1

| PJ-A | CSWP | SCPL | DEV | CGHP | SCPL' |
|---|---|---|---|---|---|
| The number of available modules | 9 | 6 | 12 | 9 | 6 |
| Processing time | 75.0 seconds | 20.0 seconds | 120.0 seconds | 10.0 seconds | 20.0 seconds |
| OHT | 12.0 seconds | 2.5 seconds | 7.0 seconds | 12.0 seconds | 8.0 seconds |
| MUT | 87.0 seconds | 22.5 seconds | 127.0 seconds | 22.0 seconds | 28.0 seconds |

First, the number of stay cycles of wafers W in each step of the transfer flow is calculated. The number of stay cycles is defined as MUT/cycle time. When numerical values after the decimal point of the calculated value is not zero, the value is rounded up and the number of stay cycles is calculated as an integer. Accordingly, the numbers of stay cycles of CSWP. SCPL, DEV, CGHP, and SCPL' in the PJ-A are 8, 2, 11, 2, and 1, respectively. These are set as the numbers of stay cycles before correction. Subsequently, the numbers of stay cycles before correction are corrected. In the correction process, assuming that one sheet of wafer W is transferred to the unit block E6 every N cycles (N is an integer), each of the numbers of stay cycles is corrected to be an integer multiples of N, which is equal to or greater than the corresponding one of the numbers of stay cycles before correction. In addition, the correction process is performed such that values obtained by the correction become as small as possible. As described above, N=3 in this example. Accordingly, the stay cycle numbers for CSWP, SCPL, DEV, and CGHP are corrected to 9, 3, 12, and 3, respectively.

Then, it is determined which of the plurality of modules constituting a multi-module is to be a transfer destination of each wafer W in the order of being loaded into the unit block E6. Regarding the determination of the transfer destination, it is first determined, in a cycle in which a wafer W for which he transfer destination is to be determined is transferred to a multi-module (for convenience of description, referred to as a "reference cycle"), how many modules constituting the multi-module are available for transferring the wafer W. That is, it is determined how many modules are not occupied by other wafers W when the wafer W is transferred in the reference cycle. When the result of the determination is only one module in the multi-module is available for transfer, the available module for transfer is determined as the transfer destination.

On the contrary, when it is determined that a plurality of modules in the multi-module is available for transfer, it is determined which of the available modules for transfer unloads a wafer W, which is transferred to the module earlier than the wafer W for which the transfer destination is to be determined, in a cycle closest to the reference cycle. The cycle closest to the reference cycle includes the same cycle as the reference cycle. Then, the module determined to unload the wafer W in the closest cycle is determined as the transfer destination of the wafer W. The transfer schedule of FIG. 3 is set by allocating transfer destinations of wafers A transferred to the unit block E6 according to the rule described above.

For example, with respect to the SCPL (SCPL1, SCPL2), a process of determining the transfer destinations of the wafers A4 in determining the transfer destinations of the wafers W in the order of the wafers A1, A4, A7, . . . will be described in detail. In the transfer schedule of FIG. 3, the cycle in which the wafer A4 is transferred to the SCPL is indicated by reference numeral 13, and in this example, the cycle 13 is the reference cycle. In the cycle 13, the wafer A1 is unloaded from the SCPL1. On the contrary, the SCPL2 is not occupied by a wafer W. Accordingly, the wafer A4 can be transferred to either of the SCPL1 and the SCPL2. When viewed from the cycle 13, a cycle in which the wafer W is unloaded from the SCPL1, rather than the SCPL2, is closer to the reference cycle, and is identical to the cycle 13. Therefore, the SCPL1 is determined as the transfer destination of the wafer A4.

According to the coating and developing apparatus 1, the cycle time is set for each unit block E as described above. Accordingly, since the time during which a wafer W stays in a module in each unit block is suppressed, it is possible to achieve a high throughput. Furthermore, it is possible to prevent the cycle time from becoming too short and to prevent the data volume of the transfer schedule from becoming enormous.

Although the standard CTs are stored in the transfer data table 3 in the above-described example, the standard CTs need not be stored in the transfer data table 3. The names of transfer recipes are stored in the transfer data table 3. Thus, when resetting the CTs, the standard CTs may be calculated and used by searching corresponding transfer recipe data from the memory 41 storing the transfer recipes therein based on the transfer recipe names. That is, it is not necessary to adopt a configuration in which the standard CTs are always held in the transfer data table 3 during the operation of the apparatus. In addition, with respect to the number of passed wafers W stored in the transfer data table 3, for example, the number of passed wafers W corresponding to a transfer recipe of a unit block E may be updated by one, whenever two sheets of wafers W pass through the unit block E in the transfer recipe. That is, distribution of the numbers of passed wafers W among the transfer recipes in the unit block E may be stored in the transfer data table 3 as the transfer history, and the present disclosure is not limited to storing the numbers of passed wafers itself in the transfer data table 3.

The present disclosure is not limited to being applied to the coating and developing apparatus 1 having the above-described configuration. Modules mounted on the processing blocks are not limited to the above example, and therefore, the substrate processing apparatus of the present disclosure is not limited to being configured as the coating and developing apparatus 1. For example, an apparatus configuration, in which a processing block is provided with a module for coating a chemical liquid for forming an insulating film, a module for supplying a cleaning liquid for cleaning wafers W, a module for supplying adhesive for bonding wafers W together, and the like, may be adopted. That is, the substrate processing apparatus of the present disclosure is not limited to being configured as a coating and developing apparatus. In addition, the present disclosure is not limited to transferring the wafers W such that the wafers W move between the unit blocks E. The wafers W may be transferred from the carrier 10 to one unit block E, and may be returned to the carrier 10 when the processes in the unit block is completed.

It shall be understood that the embodiments disclosed herein are illustrative and are not restrictive in all aspects. The above-described embodiments may be omitted, replaced, or modified in various forms without departing from the scope and spirit of the appended claims.

COMPARATIVE EXAMPLE

According to one transfer recipe, wafers W are transferred from the carrier 10 to each of the unit blocks E1 to E3 so as to perform a coating process on the wafers W, and are returned to the carrier 10. That is, the wafers W are not transferred to the unit blocks E4 to E6, and the development process is not performed on the wafers W. The cycle time of the unit blocks E1 to E3 is set to 12.0 seconds. That is, the throughput per hour is 300 sheets of wafers. On the contrary, wafers W are transferred from the carrier 10 to each of the unit blocks E4 to E6 according to another transfer recipe so as to perform a development process on the wafers W, and are returned to the carrier 10. That is, the wafers W are not transferred to the unit blocks E1 to E3, and the coating process is not performed. The cycle time of the unit blocks E4 to E6 is set to 17.0 seconds. That is, the throughput per hour is 211 sheets of wafers. With respect to modules of a certain step in the unit blocks E4 to E6, the MUT is set to be 153 seconds and the number of available modules is set to be nine. It is assumed that this step limits the processing rate of the unit blocks E4 to E6.

It is assumed that the cycle time of the unit blocks E4 to E6 is changed to 12 seconds, which is the same as the cycle time of the unit blocks E1 to E3. As described above, the number of stay cycles before correction is 13, which is obtained by rounding up the numerical values after the decimal point of MUT/cycle time (that is, calculated as 153/12=13). Then, since the number of stay cycles is corrected to be a multiple of 3 as described above, the number of stay cycles after correction becomes 15. Accordingly, a waiting time from a time when unloading a wafer from the module is ready to a time when the wafer is unloaded is 27 seconds (12 seconds×15−153 seconds=27 seconds). However, when the cycle time of the unit blocks E4 to E6 is set to 17.0 seconds without being changed, the number of stay cycles is 9 (153 seconds/17 seconds=9). Even after the number of stay cycles is corrected to be a multiple of 3, the number of stay cycles after correction is 9. Therefore, the post-waiting time is 0 seconds (17 seconds×9−153 seconds=0 seconds). That is, when the cycle time of the unit blocks E4 to E6 is set in accordance with the cycle time of the unit blocks E1 to E3, the throughput of wafers W passing through the unit blocks E4 to E6 is reduced. Therefore, as described in the above-described embodiments, it is effective to set the cycle time for each unit block.

According to the present disclosure, it is possible to set a transfer schedule capable of transferring substrates in a substrate processing apparatus such that a high throughput is achieved while suppressing an amount of data.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a plurality of unit blocks, each having a plurality of modules and a substrate transfer path, wherein the plurality of unit blocks is individually configured to sequentially transfer substrates from upstream side modules to downstream side modules to process the substrates;
   a plurality of main transfer mechanisms, each of which is provided on the substrate transfer path, wherein the plurality of main transfer mechanisms is configured to transfer, independently from one another, the substrates among the plurality of modules;
   a loading and unloading transfer mechanism configured to deliver the substrates between a carrier accommodating the substrates and each of the unit blocks so as to load and unload the substrates with respect to each of the unit blocks;
   a memory configured to store substrate transfer history for each of the unit blocks; and
   a setting part configured to update a cycle time, which is a time required for a corresponding one of the main transfer mechanisms to move around the substrate transfer path once, of each of the unit blocks based on the substrate transfer history, and configured to set a transfer schedule of the substrates in each of the unit blocks based on the updated cycle time.

2. The substrate processing apparatus of claim 1, wherein the substrate transfer history is data on the number of transferred substrates for each process performed in the unit blocks, and
   wherein the setting part is configured to calculate the cycle time based on parameters for cycle time calculation, which correspond to each process performed in the unit blocks.

3. The substrate processing apparatus of claim 2, further comprising:
   a memory configured to store transfer recipes, each of which specifies each process performed in the unit blocks,
   wherein the parameters for cycle time calculation are time parameters corresponding to each of the transfer recipes.

4. The substrate processing apparatus of claim 3, wherein the setting part is configured to:
   select parameters among the parameters for cycle time calculation, which correspond to each process performed in one of the unit blocks, based on the number of transferred substrates for each process; and update the cycle time of the one of the unit blocks based on the selected parameters.

5. The substrate processing apparatus of claim 4, wherein the selection of the parameters is performed based on comparison of the number of substrates having a preset ratio with respect to a total number of transferred substrates in the one of the unit blocks, with the number of substrates which is obtained by sequentially selecting one or more of the numbers of transferred substrates corresponding to the transfer recipes, respectively, in a descending order and summing the selected numbers of transferred substrates.

6. The substrate processing apparatus of claim 5, wherein the parameters for cycle time calculation are time parameters corresponding to the transfer recipes, and wherein the setting part is configured to update the cycle time based on a minimum value among the selected parameters.

7. The substrate processing apparatus of claim 6, wherein the setting part is configured to update the cycle time by performing an integer conversion process to correct the minimum value of the parameters to an integer.

8. The substrate processing apparatus of claim 1, wherein the setting part is configured to update the cycle time of each of the unit blocks, when a corresponding one of the main transfer mechanisms and the loading and unloading transfer mechanism do not transfer the substrates.

9. A substrate processing method comprising:

processing substrates in a plurality of unit blocks, each of which has a plurality of modules and a substrate transfer path, individually by sequentially transferring the substrates from upstream side modules to downstream side modules;

independently transferring the substrates among the plurality of modules, by a plurality of main transfer mechanisms, each of which is provided on the substrate transfer path;

loading and unloading the substrates with respect to each of the unit blocks, by a loading and unloading transfer mechanism, by delivering the substrates between a carrier accommodating the substrates and each of the unit blocks;

storing, in a memory, substrate transfer history for each of the unit blocks;

updating a cycle time, which is a time required for a corresponding one of the main transfer mechanisms to move around the substrate transfer path once, of each of the unit blocks based on the substrate transfer history; and setting a transfer schedule of the substrates in each of the unit blocks based on the updated cycle time.

* * * * *